United States Patent [19]

Schroeder et al.

[11] 4,122,547
[45] Oct. 24, 1978

[54] COMPLEMENTARY FET DRIVERS FOR PROGRAMMABLE MEMORIES

[75] Inventors: James E. Schroeder, Indialantic; Richard L. Goslin, Melbourne, both of Fla.

[73] Assignee: Harris Corporation, Cleveland, Ohio

[21] Appl. No.: 823,071

[22] Filed: Aug. 9, 1977

[51] Int. Cl.² .............................................. G11C 7/00
[52] U.S. Cl. .................................. 365/189; 307/238; 307/279; 307/DIG. 1; 365/94; 365/96
[58] Field of Search .......................... 365/189, 94, 96; 307/238, DIG. 1, 279, 270, DIG. 4, DIG. 5

[56] References Cited

U.S. PATENT DOCUMENTS

| 3,703,711 | 11/1972 | Duben | 365/189 |
| 3,986,054 | 10/1976 | Hansen et al. | 307/238 X |
| 4,037,217 | 7/1977 | Savarese | 307/238 X |
| 4,063,225 | 12/1977 | Stewart | 307/238 X |
| 4,075,690 | 2/1978 | Oberman et al. | 307/238 X |
| 4,078,261 | 3/1978 | Millhollan et al. | 307/238 X |

OTHER PUBLICATIONS

R. D. Lohman, "Applications of Mos FET's in Micro-Electronics", Mar. 1966, pp. 23-29.

Primary Examiner—Bernard Konick
Assistant Examiner—Donald McElheny
Attorney, Agent, or Firm—Leitner, Palan, Martin & Bernstein

[57] ABSTRACT

A memory having a P channel device for each storage element, complementary FET inverters as row drivers for reading and complementary FET devices connected in series as column drivers for reading. A P channel device and a resistor are connected to the source and drain of the N channel device of the row driver and a P channel device is provided as a column driver for the high writing or programming potential. The series P channel device of the column read driver is switched off during writing.

25 Claims, 1 Drawing Figure

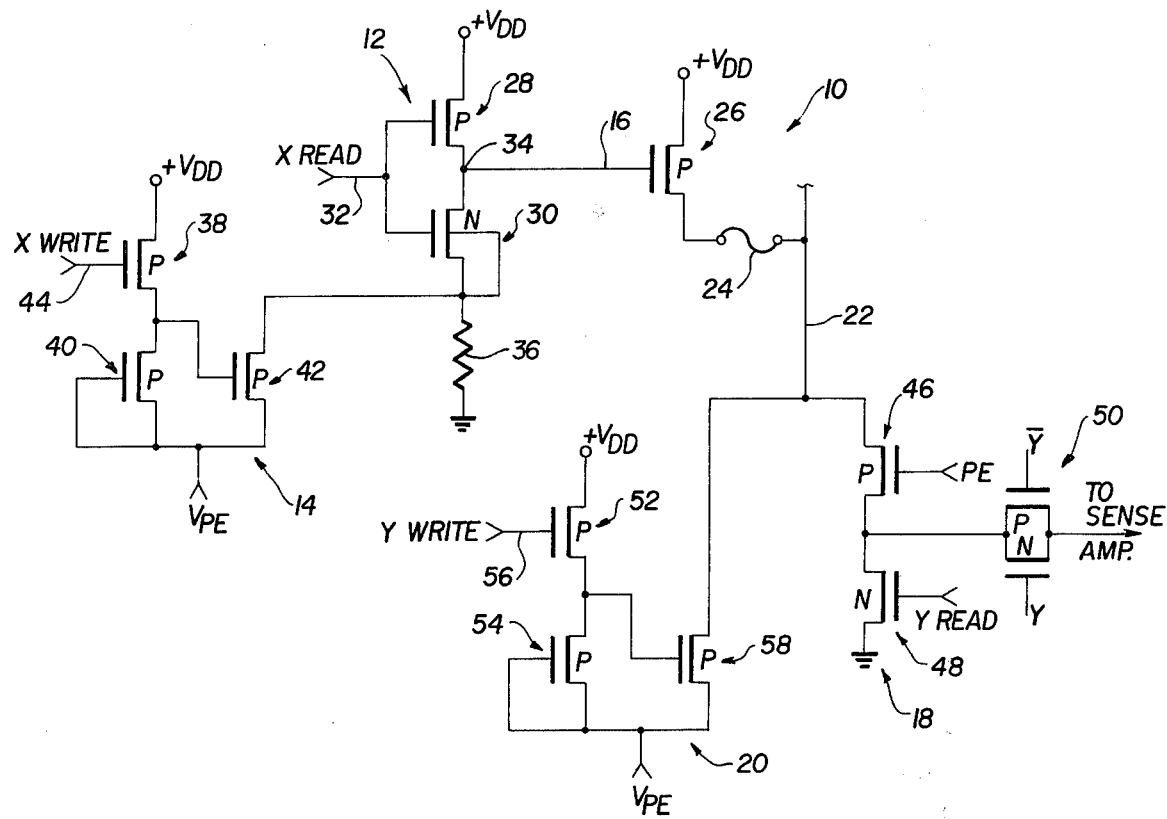

COMPLEMENTARY FET DRIVERS FOR PROGRAMMABLE MEMORIES

BACKGROUND OF THE INVENTION

The present invention relates generally to memory storage devices and more particularly to drivers circuits for reading and writing in memories using field effect transistor devices.

In the field of integrated circuit memories, the use of bipolar transistors in the driving circuit is well-known. To reduce power dissipation and increase response time, field effect transistors memories have been designed and used. For programmable memories, high voltages are needed to program, write, or store information in the memory elements. Because the programming or writing current and potentials are substantially higher than the reading currents or potentials, generally P channel field effect transistors have been used as the driver circuits. The use of a single polarity or channel devices lead to unnecessary complication of the drivers circuit besides increasing the size required for the drivers of memories. Using all N channel devices will not provide the capacity for the writing or programming potentials and currents and P channel devices alone do not have the speed which is desired for reading the memory devices.

Thus there exists a need for reading and writing drive circuits which have a minimum amount of delay during the reading cycle and which are capable of handling high potentials and currents during the writing cycle.

SUMMARY OF THE INVENTION

Present invention are field effect transistor drive circuits for programmable memories using complementary channel devices for the read cycle and P channel devices for the write cycle. The row read drivers are complementary field effect transistor inverters driving the gates of P channel devices for each of the storage or programmable elements. The column read drivers are a complementary pair of field effect transistors in series wherein the P channel device being connected directly to the storage element and the N channel device being connected in a series with the P channel device. The row write or programming drivers include a P channel device connected in series with the N channel device of row read driver having its drain connected to the source and body of the N channel device. A resistor is also connected to the source and body of the N channel device. A large negative programming voltage is applied to the drain of the P channel row writing device and is transmitted to the gate of the P channel device of the storage element device via the N channel row reading device. The connection of the P channel row writing device and the resistor to the source and body of the N channel row reading device protects the N channel reading device from the large negative writing voltage.

A P channel column writing device is connected directly to the programmable memory elements and is capable of carrying or transmitting the large negative potential to the programmable storage element. The P channel column reading device is switched off by a positive potential during the write cycle so as to isolate and thereby protect the N channel column reading device. The complementary channel devices in the row and column read drivers provide minimum delay time while the P channel devices of the row and column programming or write drivers provide the capability to handle the large writing or programming potentials. The present drivers circuits are suitable for use with programming fuse links, floating insulated gate memory cells, dual dielectric FET devices, and programming and electrically erasing amorphous devices.

OBJECTS OF THE INVENTION

An object of the present invention is to provide a field effect transistor drive for programmable memories with a minimum read time and capable handling the high programming or writing potentials.

Another object is to provide complementary field effect transistors for reading drivers and P channel field effect transistors for writing drivers of a memory.

A further object of the invention is to provide complementary field effect transistor drivers for a memory wherein the N channel devices are protected from the high programming or writing potentials.

Other objects, advantages, and novel features of the present invention will become apparent from the following detailed description of the invention when considered in conjunction with the accompanying drawings.

BRIEF DESCRIPTION OF THE DRAWINGS

The FIGURE is a schematic of the circuit embodying the reading and writing drivers according to the present invention.

DESCRIPTION OF THE PREFERRED EMBODIMENTS

A memory matrix, represented by a single storage element 10, includes a row read driver 12 and row write or program driver 14 connected to a plurality of cells in its row by line 16. A column read driver 18 and column write driver 20 are connected to the cells or storage devices in their column by line 22. An element 10 represents a single cell in the matrix. Row drivers 12 and 14 and column drivers 18 and 20 represent one of a plurality required to read and write from the memory matrix.

The storage cell 10 is illustrated as including a fuse element 24 and a P channel field effect transistor 26 having its source connected to a positive supply, $V_{DD}$, its drain connected to the fuse 24 and its gate connected to line 16. Each cell includes a fuse 24 and a P channel device 26. Although the storage or programmable element in cell 10 is illustrated as a fuse 24, obviously it may include or be represented by a floating insulated gate memory element, programmable and electrically erasable amorphous memory elements and other equivalent programmable or read/write storage elements requiring a writing or programming voltage or current higher than that normally needed for reading.

The row read driver 12 includes a complemetary field effect transistor inverter having a P channel device 28 and an N channel device 30. Their gates form a common input 32 from the row read decoder and an output 34 on their common drains is connected to the storage elements in their respective rows by line 16. The source and body of the N channel device 30 are tied together and are connected to ground by a resistor 36. The P channel device 28 has its source connected to a positive supply voltage $V_{DD}$.

The row write driver 14 includes a pair of P channel devices 38 and 40 connected in series between a positive supply voltage $V_{DD}$ and a program or write enable voltage $V_{PE}$. The gate of P channel device 38 receives a signal at terminal 44 for selection of the specific row for writing or programming and the gate of P channel device 40 is tied to the program enable voltage $V_{PE}$. A third P channel device 42 has its gate connected to the drain of the P channel device 38, its drain connected to the program enable voltage $V_{PE}$ and its source connected to the junction of resistor 36 and the source and body of N channel 30.

During one read cycle, high and low signals from the row decoder are applied to terminal 32 to cause the row read driver 12 to provide a respective low and high signal on line 16 to turn P channel device 26 on and off respectively. For a high signal, P channel device 28 is turned off and N channel device 30 is turned on thereby placing a low voltage on line 16 allowing P channel 26 to remain on and apply the voltage source $V_{DD}$ to the memory element 24. For a low signal on input 32, the P channel device 28 is on and N channel device 30 is off applying the voltage source $V_{DD}$ to line 16 turning P channel device 26 off. During the read cycles, the input on terminal 44 for the row write or program driver 14 is low, allowing P channel device 38 to conduct placing $V_{DD}$ on the gate of P channel device 42 and thus maintaining it off. With P channel device 42 off, the N channel device 30 of the row read driver is isolated from the high programming potential $V_{PE}$.

During the write or program cycle for rows other than the row of row driver 14, the signal on input 44 is low and again P channel device 42 is off. For writing in or programming the row control by row write driver 14, input on line 44 is high turning P channel device 38 off, causing the gate of P channel device 42 to be low, turning it on. This provides a large negative voltage $V_{PE}$-$2V_{TP}$ ($V_{TP}$=P channel threshold voltage) to be applied to the junction of the source and body of N channel device 30 and resistor 36 thereby turning on the N channel device 30 very hard. The connection of the source and body of N channel device 30 to resistor 36 limits the drain to source voltage of N channel device 30 and thereby protects it from the high negative programming or writing voltage $V_{PE}$.

Since N channel devices have a $BV_{dss}$ of 25–30 volts, they must be protected from the large programming voltage of approximately 30–35 volts. The write driver 14 provides protection of the N channel device 30 while allowing the high negative voltage to be applied to line 16 to turn on and drive P channel device 26 for a programmable fuse element 24. Although the resistor 36 is high enough to effect the time constant of the row read driver, it does allow the gate of the P channel device 26 to be pulled to ground.

The column read driver 18 includes a P channel device 46 connected in series with an N channel device 48. The source of the P channel device 46 is connected to line 22, its gate receives a logic or program enable signal PE and its drain is connected to the drain of N channel device 48. The source of N channel 48 is grounded and its gate receives the column read enable signal from the column read decoders. The sense amplifiers are connected to the junction of P and N channel devices 46 and 48 by a transmission gate 50 which is controlled by the input from the column read decoders.

Also connected to line 22 is the column write or program driver 20 which includes a P channel device 52 connected in a series with a P channel device 54. The source of P channel device 52 is connected to a voltage source $V_{DD}$, its gate receives the column select for writing or programming at 56 and its drain is connected to the source of P channel device 54. The gate and drain of P channel device 54 are connected to the programming voltage $V_{PE}$. A third P channel device 58 has its gate connected to the drain of P channel device 52, its drain connected to the programming voltage $V_{PE}$, and its source connected to line 22.

Column write driver 20 operates identically to row write driver 14 wherein P channel device 58 is normally off for the total read cycle and the write cycle for columns other than its column and thereby isolates line 22 from the programming voltage $V_{PE}$. Upon selection of the column of P channel device 58, a low signal is provided on this gate and it is turned on placing the high programming voltage $V_{PE}$-$2V_{TP}$ on line 22. For the selected cell or fuse 24, P channel devices 26 and 58 conduct applying a voltage of approximately $V_{DD}$-($V_{PE}$-$2V_{TP}$) thereacross, which is sufficient to blow the fuse or to program other types of programmable elements. As indicated earlier, with $V_{PE}$ being a large negative voltage, the voltage difference across the memory storage element 24 is quite high.

During normal reading operations, the column read driver 18 will receive a signal on the gate of N channel device 48 turning it on. If the row is also selected, such that P channel device 26 is turned on, a current path from $V_{DD}$ through P channel device 26, fuse element 24, line 22, P channel device 46, and N channel device 48 to ground is created. This current is sent through transmission switch 50 to the sense amplifiers. Depending upon the state of the fuse 24, a high or low logic state is sensed. During the write or programming cycle, the gate of P channel 46 receives a positive programming enable voltage on its gate thereby turning it off and completely isolating the N channel device 48 from the high writing or programming voltage.

It should be noted that P channel devices 42 and 58 which form the major portion of the write drivers are large capacity devices having channel lengths of generally 40 mils, whereas the other P and N channel devices are much smaller since the reading operation uses a smaller potential.

From the preceding description of the preferred embodiments in this element, it is evident that the objects of the invention are obtained in that complementary field effect transistor drivers are used during the read operation to minimize switching time delay and P channel drivers are used during the write or programming operation to accommodate the large writing or programming voltage. The N channel devices of the read drivers are isolated or protected from the high programming voltage by specific circuit connections. Although the memory matrix is illustrated as a programmable read only memory, the circuitry of the present invention can be used with other types of memories. Metal oxide semiconductor field effect transistors or other insulated gate field effect transistors may be used. Although the invention has been described and illustrated in detail, it is to be clearly understood that the same is by way of illustration and example only and is not to be taken by way of limitation. The spirit and scope of the invention is to be limited only by the terms of the appended claims.

What is claimed:

1. A memory matrix comprising:
   complementary field effect transistor means for enabling a row in said matrix for reading;
   complementary field effect transistor means for enabling a column in said matrix for reading;

single channel field effect transistor means for enabling a row in said matrix for writing;
single channel field effect transistor means for enabling a column in said matrix for writing;
each of said field effect transistor writing means having a capacity to operate for writing potentials higher than reading potentials.

2. The memory matrix according to claim 1 wherein said column writing means includes a P channel field effect transistor connected in series with a column of said matrix for transmitting said writing potential.

3. The memory matrix according to claim 2 including means for isolating an N channel field effect transistor of said column reading means during writing from said matrix.

4. The memory matrix according to claim 3 wherein said column reading means includes a P and a N channel field effect transistor connected in series with a column of said matrix and wherein said isolation means switches said P channel field effect transistor of said column reading means off during writing to isolate said N channel field effect transistor.

5. The memory matrix according to claim 1 wherein said row reading means includes a P channel field effect transistor connected in series with each storage element of said matrix and a complementary field effect transistor inverter connected to the gates of said P channel field effect transistors in its row.

6. The memory matrix according to claim 5 wherein said row writing means include P channel field effect transistor connected in series with said N channel field effect transistor.

7. The memory matrix according to claim 6 wherein said P channel field effect transistor has its source connected to the source and body of said N channel field effect transistor.

8. The memory matrix according to claim 7 including a resistance connected to said source of said N channel field effect transistor.

9. The memory matrix according to claim 1 wherein said column writing means includes a P channel field effect transistor connected in series with said matrix to transmit high writing potentials and said row writing means include a P channel field effect transistor connected to said matrix through said row reading means to transmit high writing potentials.

10. The memory matrix according to claim 9 wherein said row reading means includes a P channel field effect transistor connected in series with said matrix and a complementary field effect transistor inverter connected to the gate of said P channel field effect transistor, said P channel field effect transistor of said row writing means is connected in series with the N channel field effect transistor of said inverter.

11. The memory matrix according to claim 10 wherein the source of said P channel field effect transistor of said row writing means is connected to the source and body of said N channel field effect transistor and a resistance is connected to said source and body of said N channel field effect transistor.

12. The memory matrix according to claim 9 wherein said column reading means include a P channel field effect transistor connected in series with said matrix and an N channel field effect transistor connected in series with said P channel field effect transistor and said writing means switches said P channel field effect transistor of said column reading means off during writing.

13. The memory matrix according to claim 1 wherein said matrix includes memory element selected from the group of fusable elements, floating insulated gate field effect transistors, dual dielectric field effect transistors, and amorphous elements.

14. The memory matrix according to claim 1 wherein the field effect transistors of all of said field effect transistor means are insulated gate effect transistors.

15. A memory having a plurality of storage elements in rows and columns comprising:
first plurality of P channel devices, one connected to each of said storage elements;
second plurality of complementary channel devices connected to each of said rows for enabling a row of said first plurality of P channel devices for reading;
third plurality of complementary channel devices connected to each of said columns for enabling a column for reading;
fourth plurality of P channel devices connected to each of said rows for enabling a row of said first plurality of P channel devices for writing; and
fifth plurality of P channel devices connected to each of said columns for enabling a column for writing.

16. The memory according to claim 15 wherein said second plurality of complementary channel device each include a complementary channel inverter connected to the gate of respective row of said first P channel devices.

17. The memory according to claim 16 wherein said fourth plurality of P channel devices each include a fourth P channel device connected in series with a respective second N channel device and including a resistance connected to the source of each of said second N channel devices.

18. The memory according to claim 17 wherein said fourth P channel devices and said resistance are connected to the source and body of said second N channel device.

19. The memory according to claim 15 wherein said third plurality of complemetary channel devices each include a third P channel device connected in series with a respective column and a third N channel device connected in series with said third P channel device.

20. The memory according to claim 19 wherein said fifth plurality P channel each include a fifth P channel device connected in series with a respective column and includes means to switch said third P channel devices off for writing.

21. The memory according to claim 15 wherein said second and third plurality of complementary channel devices provide low potential to said storage elements for reading and said fourth and fifth P channel devices provide high potential to said storage elements for writing.

22. The memory according to claim 15 wherein said storage elements are selected from the group of fusable elements, floating insulated gate field effect transistors, dual dielectric field effect transistors, and amorphous elements.

23. In a memory matrix comprised of intersecting rows and columns with memory cells located at the intersections, in combination with write signal drivers responsive to write commands for causing memory cells to store selected bits and read signal drivers responsive to read commands for causing cells to read out the information stored therein, the improvement comprising:

write drivers comprising single channel field effect transistor means for supplying high voltage write signals to said memory cells, read drivers comprising complementary field effect transistors for supplying read voltages less than the write voltages to said memory cells for causing said memory cells to read out the information stored therein; and means for limiting the source-drain voltage of the N channel field effect transistors of said complementary field effect transistors in the presence of write signals.

24. In the memory matrix of claim 23 wherein each row is connected to a write driver and a read driver and each column is connected to a write driver and a read driver, said means for limiting the source drain voltage of the N channel field effect transistors of the read drivers connected to matrix rows comprises resistance means coupling the source and body of said N channel device to ground potential.

25. In a memory matrix of claim 24 wherein said means for limiting the source-drain voltage of the N channel field effect transistors of the column read drivers comprises signaling means for rendering the P channel device of the complementary field effect transistors in the column read drivers non-conductive in the presence of write signals.

* * * * *

UNITED STATES PATENT AND TRADEMARK OFFICE
CERTIFICATE OF CORRECTION

PATENT NO. : 4,122,547
DATED : October 24, 1979
INVENTOR(S) : James E. Schroeder et al.

It is certified that error appears in the above–identified patent and that said Letters Patent are hereby corrected as shown below:

Claim 8, column 5, line 39, insert -- and body -- between the words "source" and "of".

Signed and Sealed this

Sixth Day of November 1979

[SEAL]

Attest:

RUTH C. MASON
Attesting Officer

LUTRELLE F. PARKER
Acting Commissioner of Patents and Trademarks